US012777901B2

(12) United States Patent
Zheng et al.

(10) Patent No.: US 12,777,901 B2
(45) Date of Patent: Oct. 27, 2026

(54) INTERFACIAL LAYER FOR ANNEAL CAPPING LAYER

(71) Applicant: Applied Materials, Inc., Santa Clara, CA (US)

(72) Inventors: Yi Zheng, Sunnyvale, CA (US); Xiaozhou Che, Santa Clara, CA (US); Qiang Ma, Cupertino, CA (US); Jun Fang, Xi'an (CN)

(73) Assignee: APPLIED MATERALS, INC.

( * ) Notice: Subject to any disclaimer, the term of this patent is extended or adjusted under 35 U.S.C. 154(b) by 376 days.

(21) Appl. No.: 18/398,532

(22) Filed: Dec. 28, 2023

(65) Prior Publication Data

US 2025/0006507 A1 Jan. 2, 2025

(51) Int. Cl.

*H10P 95/90* (2026.01)
*H10P 14/20* (2026.01)
*H10P 14/24* (2026.01)
*H10P 30/20* (2026.01)

(52) U.S. Cl.

CPC .............. *H10P 95/90* (2026.01); *H10P 14/24* (2026.01); *H10P 14/2904* (2026.01); *H10P 14/3208* (2026.01); *H10P 14/3211* (2026.01); *H10P 14/3406* (2026.01); *H10P 30/2042* (2026.01)

(58) Field of Classification Search

CPC ...... H10P 95/90; H10P 14/24; H10P 14/2904; H10P 14/3208; H10P 14/3211; H10P 14/3406; H10P 30/2042

See application file for complete search history.

(56) References Cited

U.S. PATENT DOCUMENTS

| | | | | |
|---|---|---|---|---|
| 4,524,106 | A * | 6/1985 | Flasck | C23C 14/0605 427/407.1 |
| 5,380,566 | A * | 1/1995 | Robertson | C23C 16/56 427/535 |
| 7,341,957 | B2 | 3/2008 | Sandhu et al. | |
| 7,807,233 | B2 | 10/2010 | Ruelke et al. | |
| 9,865,459 | B2 | 1/2018 | Cheng et al. | |
| 2011/0268993 | A1 * | 11/2011 | Hellwig | G11B 5/737 428/641 |
| 2016/0372328 | A1 * | 12/2016 | Kawada | H10P 95/90 |
| 2022/0216050 | A1 | 7/2022 | Yu et al. | |
| 2023/0041963 | A1 * | 2/2023 | Prasad | C23C 16/26 |

* cited by examiner

*Primary Examiner* — Peter M Albrecht
(74) *Attorney, Agent, or Firm* — Moser Taboada

(57) ABSTRACT

A method of forming a capping layer on a substrate for annealing processes incorporates an interfacial layer of a material that is at least one element of a chemical compound used in the substrate. In some embodiments, the method may comprise depositing an interfacial layer on the substrate where the interfacial layer is amorphous silicon (a-Si), amorphous $SiC_x$, or amorphous $SiC_xN$ (where X is greater than zero to approximately 2), depositing an amorphous carbon (a-C) capping layer on the substrate, and annealing the substrate at a temperature of approximately 1500 degrees Celsius or higher. The interfacial layer may have a thickness of approximately 5 nanometers to approximately 100 nanometers and may be formed on planar structures or on three-dimensional structures.

20 Claims, 3 Drawing Sheets

INTERFACIAL LAYER FOR ANNEAL CAPPING LAYER

CROSS-REFERENCE TO RELATED APPLICATIONS

This application claims the benefit of Patent Cooperation Treaty Application PCT/CN2023/105050, filed on 30 Jun. 2023, which is herein incorporated by reference in its entirety.

FIELD

Embodiments of the present principles generally relate to semiconductor processing of semiconductor substrates.

BACKGROUND

During the manufacturing of semiconductor structures, materials may be impregnated with dopants to alter the characteristics of the material. The doped materials may then undergo an annealing process to activate the dopants. A capping layer is used on top of the material undergoing activation to prevent any sublimation or damage to the doped material. The inventors have observed, however, that for some materials with extremely high annealing temperatures, the activation anneal damages the doped material layer despite the application of a capping layer.

Accordingly, the inventors have provided methods for improving high temperature activation annealing while preserving the underlying doped material.

SUMMARY

Methods for improving high temperature activation annealing are provided herein.

In some embodiments, a method of forming a capping layer on a silicon carbide (SiC) substrate may comprise depositing an interfacial layer on the SiC substrate, wherein the interfacial layer is amorphous silicon (a-Si), amorphous $SiC_x$, or amorphous $SiC_xN_y$ and depositing an amorphous carbon (a-C) capping layer on the interfacial layer on the SiC substrate.

In some embodiments, the SiC substrate will undergo ion implantation prior to depositing of the interfacial layer, the X value is greater than zero to approximately 2, the method can be performed in a single process chamber, the interfacial layer can be formed using a precursor of $SiH_4$ or $SiC_xH_y$, the interfacial layer can have a thickness of approximately 5 nanometers to approximately 100 nanometers, the deposition can be performed by chemical vapor deposition (CVD), the interfacial layer can be deposited on a three-dimensional structure, and/or the annealing of the SiC substrate can be performed at a temperature of 1750 degrees Celsius or higher after depositing the a-C capping layer.

In some embodiments, a method of processing a silicon carbide (SiC) substrate may comprise performing an ion implantation process on the SiC substrate, depositing an interfacial layer on the SiC substrate after performing the ion implantation process where the interfacial layer is amorphous silicon (a-Si), amorphous $SiC_x$, or amorphous $SiC_xN_y$, depositing an amorphous carbon (a-C) capping layer on the interfacial layer on the SiC substrate, and annealing the SiC substrate at a temperature of approximately 1500 degrees Celsius or higher.

In some embodiments, the interfacial layer has a thickness of approximately 5 nanometers to approximately 100 nanometers, the X value is greater than zero to approximately 2, the depositing of the interfacial layer and the depositing of the a-C capping layer is performed in a single process chamber, the interfacial layer is formed using a precursor of $SiH_4$ or $SiC_xH_y$, the deposition is performed by chemical vapor deposition (CVD), and/or the interfacial layer is deposited on a three-dimensional structure.

In some embodiments, a non-transitory, computer readable medium having instructions stored thereon that, when executed, cause a method of forming a capping layer on a silicon carbide (SiC) substrate to be performed, the method may comprise depositing an interfacial layer on the SiC substrate, wherein the interfacial layer is amorphous silicon (a-Si), amorphous $SiC_x$, or amorphous $SiC_xN_y$ and depositing an amorphous carbon (a-C) capping layer on the interfacial layer on the SiC substrate.

In some embodiments, the SiC substrate has undergone ion implantation prior to depositing of the interfacial layer, the depositing the interfacial layer is to a thickness of approximately 5 nanometers to approximately 100 nanometers, annealing of the SiC substrate is at a temperature of approximately 1650 degrees Celsius or higher, the method is performed in a single process chamber, the interfacial layer is formed using a precursor of $SiH_4$ or $SiC_xH_y$, the deposition is performed by chemical vapor deposition (CVD) and/or the interfacial layer is deposited on a three-dimensional structure.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

Figure 1:
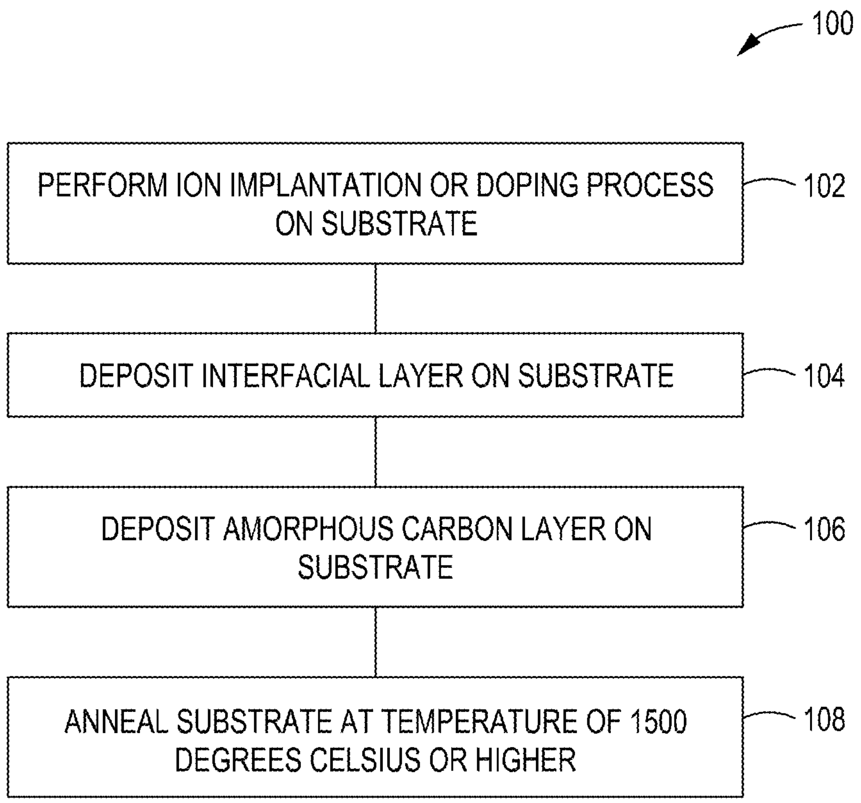
FIG. 1 is a method of processing a substrate including forming a capping layer for annealing in accordance with some embodiments of the present principles.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods provide improved protection of underlying doped material layers during high temperature annealing processes. An interfacial layer is introduced between the doped material layer and a capping layer that allows for increased temperature anneals without causing damage to the underlying doped material layers. In some instances, the annealing temperature can be increased to 2000 degrees Celsius with the use of the interfacial layer. The processes can be used, for example, on planar surfaces or structured (three-dimensional) surfaces and the like to preserve the doped material layer during high temperature annealing. The higher temperature annealing provided by the present techniques enables better activation annealing results and the use of different doped materials. Moreover, the higher temperature anneal may help reduce defects density, such as stacking faults and Basal plane dislocations, in the single crystalline silicon carbide (SiC).

Traditionally, photoresist is used as an anneal capping layer but has high shrinkage at high temperatures and also has outgassing that contaminates furnaces used in the annealing process. Amorphous carbon (a-C) provides a better anneal capping layer than photoresist for power device processing that requires higher temperatures (e.g., up to 1700 degrees Celsius) such as, for example, SiC dopant activation anneal processes (temperatures >1500 degrees Celsius). At such high temperatures, Si atoms sublimate, causing carbon cluster formation and high roughness on SiC surface that leads to poor channel mobility. An anneal capping layer is necessary to prevent the Si atom sublimation. Although an a-C anneal capping layer is preferred over photoresist for temperatures up to 1700 degrees Celsius, at temperatures beyond 1700 degrees Celsius (approximately 1750 degrees Celsius to approximately 1800 degrees Celsius), the inventors have found that the underlying SiC material layer becomes very rough from the interaction of the SiC material layer with the a-C anneal capping layer.

The SiC material layer was found by the inventors to decompose into a carbon layer between the SiC material layer and the a-C anneal capping layer, severely degrading the properties of the SiC device. The inventors discovered that by depositing an interfacial layer on the SiC material layer before depositing the a-C anneal capping layer, the SiC material layer can be annealed at higher temperatures (up to 2000 degrees Celsius) without damaging the SiC material layer. In some embodiments, a thin amorphous Si (a-Si), $SiC_x$, or $SiC_xN_y$ interfacial layer is deposited to minimize interaction between a-C and SiC material layer that causes SiC decomposition. The interfacial layer can be readily deposited using existing semiconductor processing chambers. The interfacial layer and the a-C anneal capping layer can be deposited in a single chamber for maximum throughput or by using multiple chambers. A-Si can be grown with various precursors including, but not limited to, silane ($SiH_4$), and the like. $SiC_x$ or $SiC_xN_y$ can be grown with various precursors in the family of $SiC_xH_y$, such as, but not limited to, Tetramethylsilane (TMS), and the like.

FIG. 1 is a method 100 of processing a substrate including forming a capping layer for annealing. The substrate 202, as depicted in a view 200A of FIG. 2, may include a planar structure surface 206 and/or a trench and the like as part of a 3D structure surface 204 and the like. In some embodiments, the structure on the substrate may be a gate channel structure for a transistor and the like such as for a power transistor. In some embodiments, the substrate 202 may be composed of SiC such as crystallized SiC used for forming a high mobility channel of a power transistor. In some instances, as per block 102, the substrate may have undergone an implantation 220 or doping process prior to deposition of an interfacial layer 208 as depicted in a view 200B of FIG. 2. In block 104, the interfacial layer 208 is deposited on the substrate 202 as depicted in a view 200C of FIG. 2. The interfacial layer 208 may be deposited on a planar structure and/or a 3D structure and the like. In some embodiments, the interfacial layer 208 may be deposited to a thickness of approximately 5 nm to approximately 100 nm. The thickness may be varied depending on the annealing temperature and the duration of the anneal process.

In some embodiments, the interfacial layer 208 is a material that is at least one element of a chemical compound used in the substrate. In some embodiments, the interfacial layer 208 may be composed of a-Si that may be deposited on a SiC substrate using a precursor such as silane ($SiH_4$) and the like on a SiC substrate. In some embodiments, the interfacial layer 208 may be composed of a-$SiC_x$ that may be deposited on a SiC substrate using a precursor such as trimethyl-silane and the like and other organic silicon ($SiC_xH_y$) precursors. The X-value of a-$SiC_x$ may be from greater than zero to approximately 2 to allow for tunability of the interfacial layer. The X-value can be adjusted during deposition by a process control and/or precursor composition and the like. In some embodiments, the X-value is less than approximately 1. The ratio of carbon to silicon may be varied depending on the annealing temperature and the duration of the anneal process. In some embodiments, the interfacial layer 208 may be composed of a-$SiC_xN$. The added nitrogen, in some circumstances, may provide a beneficial residual nitrogen source in subsequent processing of the structure on the substrate. In general, hydrogen will be present at various levels during deposition. Process controls during deposition may also include, but are not limited to, temperatures, pressures, precursor flow rates, and/or precursor compositions and the like.

Figure 2:
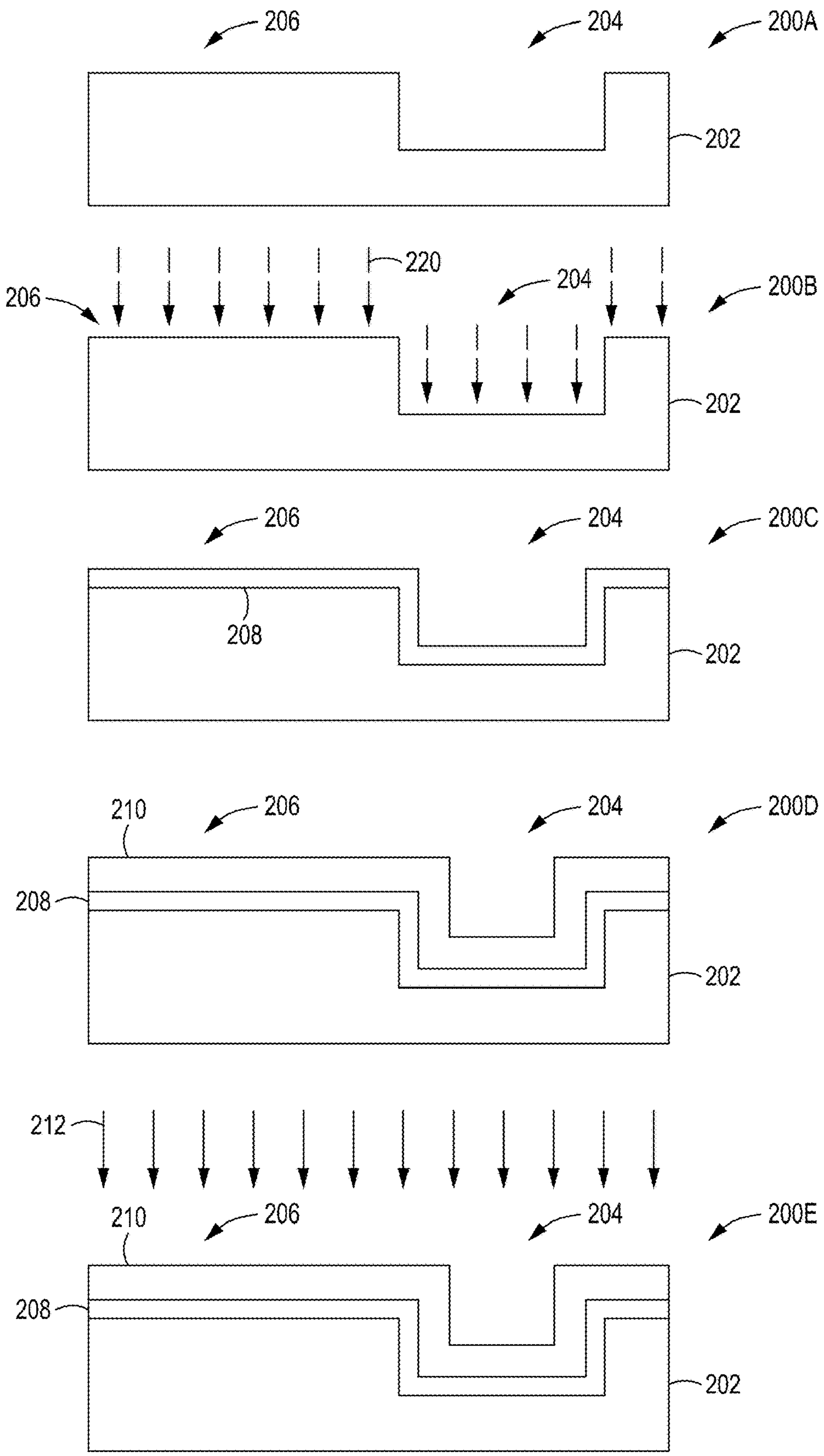
FIG. 2 depicts cross-sectional views of a process for forming the capping layer in accordance with some embodiments of the present principles.

In block 106, an a-C layer 210 is deposited directly onto the interfacial layer 208 as depicted in a view 200D of FIG. 2. In some embodiments, both the interfacial layer 208 and the a-C layer 210 may be deposited within the same process chamber by altering precursors during depositions, thereby increasing throughput by not having to move the substrate between depositions. The a-C layer 210 acts as an anneal capping layer for the substrate during annealing processes. The interfacial layer 208 and the a-C layer 210 may be deposited using a CVD process and/or a plasma enhanced CVD process. In block 108, the substrate 202 undergoes an annealing process 212 as depicted in a view 200E of FIG. 2. The annealing process 212 may include heat sources above and/or below (not shown) the substrate 202. The annealing process may be 1500 degrees Celsius or higher. In some embodiments, the annealing process may be 1700 degrees Celsius or above. In some embodiments, the annealing process may be 1750 degrees Celsius or above. In some embodiments, the annealing process may be 1800 degrees Celsius or above. In some embodiments, the annealing process may be 1850 degrees Celsius or above. In some embodiments, the annealing process may be approximately 2000 degrees Celsius.

Figure 3:
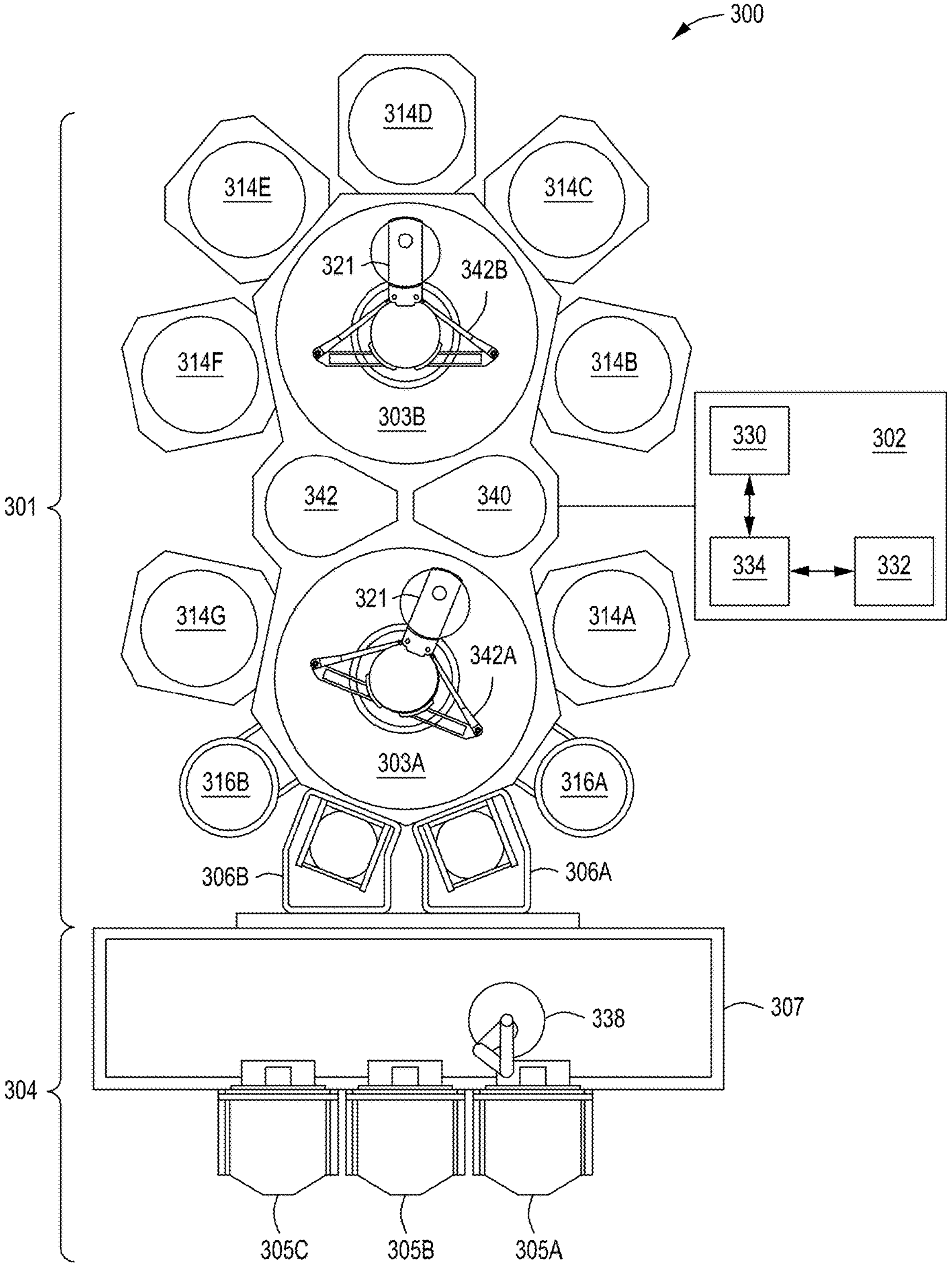
FIG. 3 is a top-down view of an integrated process tool in accordance with some embodiments of the present principles.

The methods described herein may be performed in an individual process chamber or may be performed in a cluster tool such as, for example, an integrated tool 300 described below with respect to FIG. 3. The advantage of using an integrated tool 300 is that there is no vacuum break and no substantial process lag between depositions. The integrated tool 300 includes a vacuum-tight processing platform 301, a factory interface 304, and a system controller 302. The processing platform 301 comprises multiple processing chambers, such as 314A, 314B, 314C, 314D, 314E, 314F, and 314G operatively coupled to a vacuum substrate transfer chamber (transfer chambers 303A, 303B). The factory interface 304 is operatively coupled to the transfer chamber 303A by one or more load lock chambers (two load lock chambers, such as 306A and 306B shown in FIG. 3).

In some embodiments, the factory interface 304 comprises at least one docking station 307, at least one factory interface robot 338 to facilitate the transfer of the semiconductor substrates. The docking station 307 is configured to accept one or more front opening unified pods (FOUP). Three FOUPS, such as 305A, 305B, and 305C are shown in the embodiment of FIG. 3. The factory interface robot 338 is configured to transfer the substrates from the factory interface 304 to the processing platform 301 through the load lock chambers, such as 306A and 306B. Each of the load lock chambers 306A and 306B have a first port coupled to the factory interface 304 and a second port coupled to the transfer chamber 303A. The load lock chamber 306A and 306B are coupled to a pressure control system (not shown) which pumps down and vents the load lock chambers 306A and 306B to facilitate passing the substrates between the vacuum environment of the transfer chamber 303A and the substantially ambient (e.g., atmospheric) environment of the factory interface 304. The transfer chambers 303A, 303B have vacuum robots 342A, 342B disposed in the respective transfer chambers 303A, 303B. The vacuum robot 342A is capable of transferring substrates 321 between the load lock chamber 306A, 306B, the processing chambers 314A and 314G and a cooldown station 340 or a pre-clean station 342. The vacuum robot 342B is capable of transferring substrates 321 between the cooldown station 340 or pre-clean station 342 and the processing chambers 314B, 314C, 314D, 314E, and 314F.

In some embodiments, the processing chambers 314A, 314B, 314C, 314D, 314E, 314F, and 314G are coupled to the transfer chambers 303A, 303B. The processing chambers 314A, 314B, 314C, 314D, 314E, 314F, and 314G may comprise a pre-clean chamber, a CVD chamber, a PECVD chamber, an ALD chamber, and/or a PVD chamber. The process chambers may include any chambers suitable to perform all or portions of the methods described herein, as discussed above. In some embodiments, one or more optional service chambers (shown as 316A and 316B) may be coupled to the transfer chamber 303A. The service chambers 316A and 316B may be configured to perform other substrate processes, such as degassing, orientation, substrate metrology, cool down, and the like.

The system controller 302 controls the operation of the tool 300 using a direct control of the process chambers 314A, 314B, 314C, 314D, 314E, 314F, and 314G or alternatively, by controlling the computers (or controllers) associated with the process chambers 314A, 314B, 314C, 314D, 314E, 314F, and 314G and the tool 300. In operation, the system controller 302 enables data collection and feedback from the respective chambers and systems to optimize performance of the tool 300. The system controller 302 generally includes a Central Processing Unit (CPU) 330, a memory 334, and a support circuit 332. The CPU 330 may be any form of a general-purpose computer processor that can be used in an industrial setting. The support circuit 332 is conventionally coupled to the CPU 330 and may comprise a cache, clock circuits, input/output subsystems, power supplies, and the like. Software routines, such as a method as described above may be stored in the memory 334 and, when executed by the CPU 330, transform the CPU 330 into a specific purpose computer (system controller 302). The software routines may also be stored and/or executed by a second controller (not shown) that is located remotely from the tool 300.

The memory 334 is in the form of computer-readable storage media that contains instructions, when executed by the CPU 330, to facilitate the operation of the semiconductor processes and equipment. The instructions in the memory 334 are in the form of a program product such as a program that implements the method of the present principles. The program code may conform to any one of a number of different programming languages. In one example, the disclosure may be implemented as a program product stored on a computer-readable storage media for use with a computer system. The program(s) of the program product define functions of the aspects (including the methods described herein). Illustrative computer-readable storage media include, but are not limited to: non-writable storage media (e.g., read-only memory devices within a computer such as CD-ROM disks readable by a CD-ROM drive, flash memory, ROM chips, or any type of solid-state non-volatile semiconductor memory) on which information is permanently stored; and writable storage media (e.g., floppy disks within a diskette drive or hard-disk drive or any type of solid-state random access semiconductor memory) on which alterable information is stored. Such computer-readable storage media, when carrying computer-readable instructions that direct the functions of the methods described herein, are aspects of the present principles.

Embodiments in accordance with the present principles may be implemented in hardware, firmware, software, or any combination thereof. Embodiments may also be implemented as instructions stored using one or more computer readable media, which may be read and executed by one or more processors. A computer readable medium may include any mechanism for storing or transmitting information in a form readable by a machine (e.g., a computing platform or a "virtual machine" running on one or more computing platforms). For example, a computer readable medium may include any suitable form of volatile or non-volatile memory. In some embodiments, the computer readable media may include a non-transitory computer readable medium.

While the foregoing is directed to embodiments of the present principles, other and further embodiments of the principles may be devised without departing from the basic scope thereof.

The invention claimed is:

1. A method of forming a capping layer on a silicon carbide (SiC) substrate, comprising:

depositing an interfacial layer on the SiC substrate, wherein the interfacial layer is amorphous silicon (a-Si), amorphous $SiC_x$, or amorphous $SiC_xN_y$ and wherein the interfacial layer has a thickness of approximately 5 nm to approximately 100 nm; and depositing an amorphous carbon (a-C) capping layer on the interfacial layer on the SiC substrate.

2. The method of claim 1, wherein the SiC substrate has undergone ion implantation prior to depositing of the interfacial layer.

3. The method of claim 1, wherein X is greater than zero to approximately 2.

4. The method of claim 1, wherein the method is performed in a single process chamber.

5. The method of claim 1, wherein the interfacial layer is formed using a precursor of $SiH_4$ or $SiC_xH_y$.

6. The method of claim 1, wherein the thickness of the interfacial layer is selected based on at least one of a target annealing temperature, a duration of an annealing process, or a composition of the interfacial layer.

7. The method of claim 1, wherein deposition is performed by chemical vapor deposition (CVD).

8. The method of claim 1, wherein the interfacial layer is deposited on a three-dimensional structure comprising at least one trench or non-planar surface.

9. The method of claim 1, further comprising:

annealing the SiC substrate at a temperature of 1850 degrees Celsius or higher after depositing the a-C capping layer.

10. A method of processing a silicon carbide (SiC) substrate, comprising:

performing an ion implantation process on the SiC substrate;

depositing an interfacial layer on the SiC substrate after performing the ion implantation process, wherein the interfacial layer is amorphous silicon (a-Si), amorphous $SiC_x$, or amorphous $SiC_xN_y$ and wherein the interfacial layer has a thickness of approximately 5 nm to approximately 100 nm;

depositing an amorphous carbon (a-C) capping layer on the interfacial layer on the SiC substrate; and annealing the SiC substrate at a temperature of approximately 1500 degrees Celsius or higher.

11. The method of claim 10, wherein the thickness of the interfacial layer is selected based on at least one of a target annealing temperature, a duration of an annealing process, or a composition of the interfacial layer.

12. The method of claim 10, wherein X is greater than zero to approximately 2.

13. The method of claim 10, wherein depositing the interfacial layer and depositing the a-C capping layer is performed in a single process chamber.

14. The method of claim 10, wherein the interfacial layer is formed using a precursor of $SiH_4$ or $SiC_xH_y$.

15. The method of claim 10, wherein deposition is performed by chemical vapor deposition (CVD).

16. The method of claim 10, wherein the interfacial layer is deposited on a three-dimensional structure comprising at least one trench or non-planar surface.

17. A non-transitory, computer readable medium having instructions stored thereon that, when executed, cause a method of forming a capping layer on a silicon carbide (SiC) substrate to be performed, the method comprising:

depositing an interfacial layer on the SiC substrate, wherein the interfacial layer is amorphous silicon (a-Si), amorphous $SiC_x$, or amorphous $SiC_xN_y$ and wherein the interfacial layer has a thickness of approximately 5 nm to approximately 100 nm; and depositing an amorphous carbon (a-C) capping layer on the interfacial layer on the SiC substrate.

18. The non-transitory, computer readable medium of claim 17, wherein the SiC substrate has undergone ion implantation prior to depositing of the interfacial layer.

19. The non-transitory, computer readable medium of claim 17, the method further comprising selecting the thickness of the interfacial layer based on at least one of a target annealing temperature, a duration of an annealing process, or a composition of the interfacial layer.

20. The non-transitory, computer readable medium of claim 17, the method further comprising at least one of (a), (b), (c), and (d):

(a) annealing the SiC substrate at a temperature of approximately 1850 degrees Celsius or higher;

(b) wherein the interfacial layer is formed using a precursor of $SiH_4$ or $SiC_xH_y$;

(c) wherein deposition is performed by chemical vapor deposition (CVD); or (d) wherein the interfacial layer is deposited on a three-dimensional structure comprising at least one trench or non-planar surface.

* * * * *